United States Patent [19]

Rokugo

[11] Patent Number: 5,694,068

[45] Date of Patent: Dec. 2, 1997

[54] DIGITAL PHASE-LOCKED LOOP (PLL) HAVING MULTILEVEL PHASE COMPARATORS

[75] Inventor: Yoshinori Rokugo, Tokyo, Japan

[73] Assignee: NEC Corporation, Tokyo, Japan

[21] Appl. No.: 637,608

[22] Filed: Apr. 25, 1996

[30] Foreign Application Priority Data

Apr. 28, 1995 [JP] Japan ................................. 7-105933

[51] Int. Cl.$^6$ ............................................. H03L 7/06
[52] U.S. Cl. ...................... 327/159; 327/144; 327/147; 327/160; 331/1 A; 331/25
[58] Field of Search ............................. 327/144, 147, 327/149, 150, 156, 158, 159, 160; 331/1 A, 8, 17, 25, 27, 57, DIG. 2; 375/327, 371–376

[56] References Cited

U.S. PATENT DOCUMENTS

| 4,808,884 | 2/1989 | Hull et al. | 375/376 |
| 5,268,653 | 12/1993 | Lafon | 331/1 A |
| 5,463,351 | 10/1995 | Marko et al. | 327/159 |
| 5,552,727 | 9/1996 | Nakao | 327/149 |

OTHER PUBLICATIONS

Yoshinori Rokugo et al., "Digital Phase Locked Loop Used for the Stuffing Synchronization Systems", *Electronic Information Communications Conference Papers*, BI, vol. J73–B–I, No. 8, Aug. 1990, pp. 650–659.

*Primary Examiner*—Timothy P. Callahan
*Assistant Examiner*—Kenneth B. Wells
*Attorney, Agent, or Firm*—Sughrue, Mion, Zinn, Macpeak & Seas, PLLC

[57] ABSTRACT

Using positive-phase or negative-phase clocks of phase count clock $Pf_0$, a number M of multilevel quantized phase comparators output as values quantized in multiple levels the phase differences of output signals outputted from first and second N-stage frequency dividers wherein input clocks and output clocks, respectively, of a digital PLL have been N-stage frequency divided and moreover, divided into M groups. An adder adds this phase difference information and outputs advanced pulses or delayed pulses. An N1 counter counts up in response to advanced pulses and both outputs an increment pulse and undergoes setting to initial value N1 upon counting up to 2N1. In response to delayed pulses, the N1 counter counts down, and upon counting down to "0" both outputs a decrement pulse and undergoes setting to initial value N1.

4 Claims, 6 Drawing Sheets

DIGITAL PHASE-LOCKED LOOP (PLL) HAVING MULTILEVEL PHASE COMPARATORS

BACKGROUND OF THE INVENTION

1. Field of the Invention

The present invention relates to a digital phase-locked loop (PLL) used in a cell decomposition circuit in an ATM or bit or zero stuffing synchronization device.

2. Explanation of the Related Art

In a digital PLL of the prior art in which two N-stage frequency dividers are added to the first stage of a digital PLL, an input signal is inputted to an input of one N-stage frequency divider and the output signal of the digital PLL is inputted to an input of the other N-stage frequency divider, and following N-stage frequency division of each of the signals, the signals are inputted to a multilevel quantized phase comparator.

Figure 1:
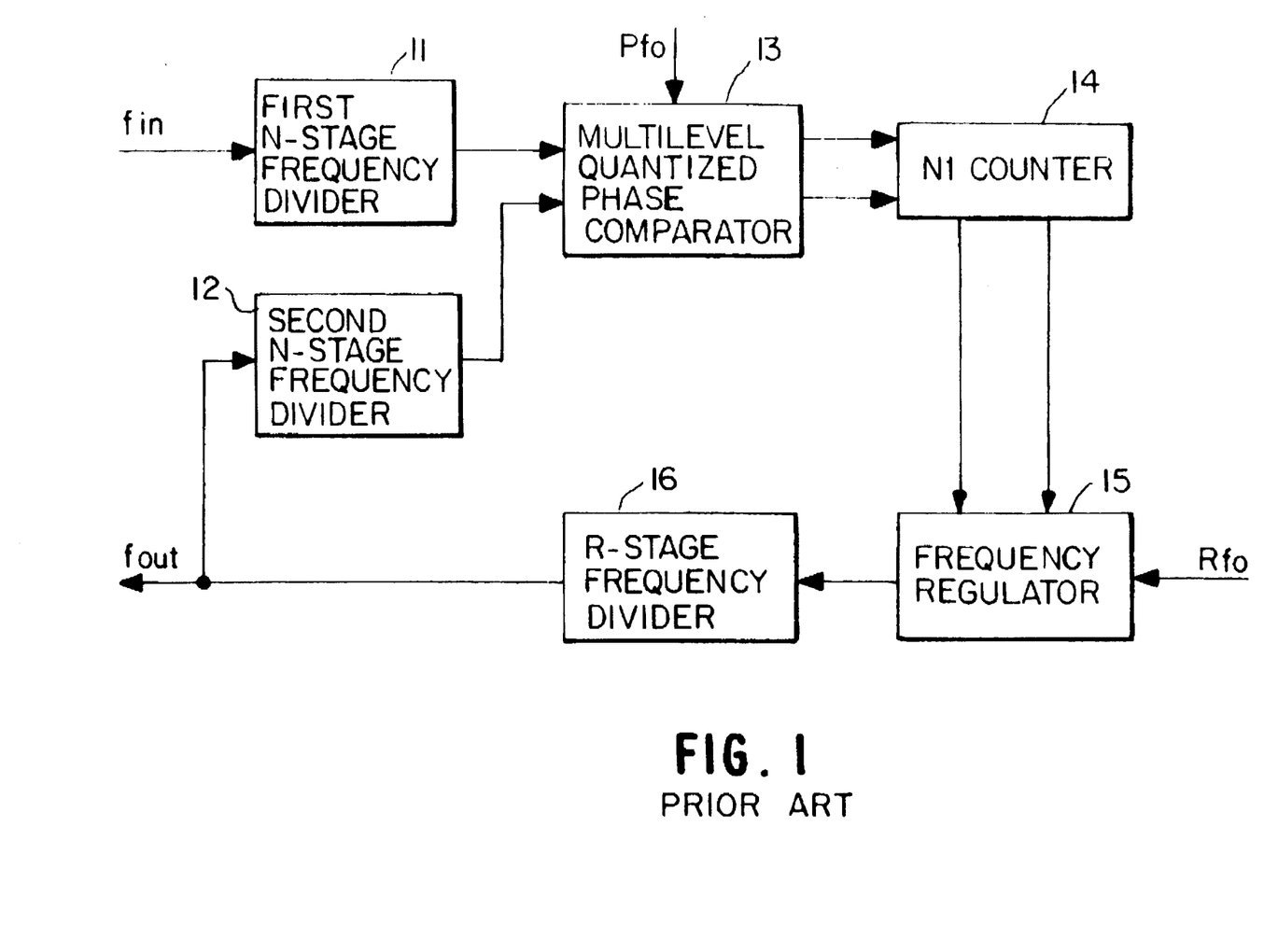
FIG. 1 is a block diagram of one example of a digital PLL of the prior art.

FIG. 1 is a block diagram of a prior-art digital PLL. A digital PLL input clock $F_{in}$ and output clock $f_{out}$ are inputted to first and second N-stage frequency dividers 11 and 12, respectively, and subjected to N-stage frequency division. Multilevel quantized phase comparator 13, which is driven by phase comparator clock $Pf_0$, receives the output clocks of N-stage frequency dividers 11 and 12 and outputs output phase error information (advanced pulses or delayed pulses) indicating the phase advance/phase delay of the outputs of both clocks $f_{in}$, $f_{out}$. N1 counter 14 is a competitive counter which inputs the advanced pulses or delayed pulses, counts up in response to advanced pulses, and upon counting up to count value $2N_1$, outputs an increment pulse frequency regulator 15 and undergoes setting to initial value $N_1$. N1 counter 14 counts down in response to delayed pulses, and upon counting down to "0," outputs a decrement pulse to frequency regulator 15 and undergoes setting to initial value $N_1$. Frequency regulator 15 is driven by a standard drive clock $Rf_0$ and clears one pulse from the pulse train of standard drive clock $Rf_0$ when one increment pulse is received from N1 counter 14, and adds one pulse to the pulse train of standard drive clock $Rf_0$ when one decrement pulse is received from N1 counter 14. R-stage frequency divider 16 effects R-stage frequency division upon the output of frequency regulator 15 and outputs the output clock $f_{out}$.

In the above-described prior-art digital PLL, however, because the input to multilevel quantized phase comparators is N-stage frequency divided by N-stage frequency dividers, phase comparison is effected 1/N the number of times than in a case in which N-stage frequency dividers are not employed. In other words, the gain of the switching network is reduced to 1/N, phase error information obtained per second drops to an insufficient level, and unwanted jitter (variations in phase) is generated.

Furthermore, if half-clock control is selected for controlling the frequency regulator of the digital PLL, there is the further drawback that half-clock phase error cannot be detected in the phase comparator because the sampling interval of phase error detection in the phase comparator is 1 clock.

SUMMARY OF THE INVENTION

The object of the present invention is to provide a digital PLL in which half-clock phase control carried out in the frequency regulator can be detected in the phase comparator, and moreover, which prevents a drop in gain of the switching network and prevents the occurrence of unwanted jitter.

In one embodiment of the present invention, a first N-stage dividing means divides the input clock of the digital PLL into N clocks having N phases. The N clocks are separated into M groups (N>M) and outputs signals representing each of the resulting groups. A second N stage frequency dividing means frequency divides the output clock of the digital PLL. The N clocks are also separated into M groups (N>M) and outputs signals representing each of the resulting groups. Each of M multilevel quantized phase comparison means inputs a respective one of the M group signals from the first N-stage dividing means and a respective one of the M group signals from the second N-stage dividing means and outputs the phase difference between the two signals which have been input as a value quantized in multiple levels.

An adding means adds the phase differences output from each of the plurality of multilevel quantized phase comparison means and outputs advanced pulses indicating a phase advance and delayed pulses indicating a phase delay. A counting means counts up in response to an advanced pulse and counts down in response to a delayed pulse until the counting means reaches a predetermined value. When the counting means reaches a predetermined value, an increment pulse or a decrement is output and the counting means reset to a predetermined initial value. If an increment pulse is output, a frequency regulating means eliminates one pulse from a standard drive clock pulse train in the PLL. If a decrement pulse is output, the frequency regulating means adds one pulse to the standard drive clock pulse train. An R-stage frequency dividing means frequency divides the resulting output of the frequency regulating means and outputs the output clock of the digital PLL.

The M multilevel quantized phase comparison means include a first plurality of multilevel quantized phase comparison means driven by a phase count clock of positive phase and a second plurality of multilevel quantized phase comparison means driven by a phase count clock of negative phase.

An N-order digital PLL of the present invention includes the above-described digital PLL.

In another embodiment of the present invention, a first N-stage dividing means divides the input clock of the digital PLL into N clocks having N phases. The N clocks are separated into M groups (N>M) and outputs signals representing each of the resulting groups. A second N stage frequency dividing means frequency divides the output clock of the digital PLL. The N clocks are also separated into M groups (N>M) and outputs signals representing each of the resulting groups. Each of M multilevel quantized phase comparison means inputs a respective one of the M group signals from the first N-stage dividing means and a respective one of the M group signals from the second N-stage dividing means and outputs the phase difference between the two signals which have been input as a value quantized in multiple levels.

A counting means inputs advanced pulses indicating phase advance or delayed pulses indicating phase delay outputted by respective M multilevel quantized phase comparison means. The counting means counts up in response to an advanced pulse and counts down in response to a delayed pulse until the counting means reaches a predetermined value. When the counting means reaches a predetermined value, an increment pulse or a decrement is output and the counting means reset to a predetermined initial value.

An adding means adds increment pulses or decrement pulses from the counting means and outputs pulses of advance phase or delayed phase. If an increment pulse is output, a frequency regulating means eliminates one pulse from a standard drive clock pulse train in the PLL. If a decrement pulse is output, the frequency regulating means adds one pulse to the standard drive clock pulse train. An R-stage frequency dividing means frequency divides the resulting output of the frequency regulating means and outputs the output clock of the digital PLL. The M multilevel quantized phase comparison means include a first plurality of multilevel quantized phase comparison means driven by a phase count clock of positive phase and a second plurality of multilevel quantized phase comparison means driven by a phase count clock of negative phase.

By employing multiple multilevel quantized phase comparison means, the phase error information obtained in one second can be increased M-fold and the system gain can be increased M-fold. Moreover, generated phase jitter can be reduced because accurate phase error information can be obtained.

The above and other objects, features, and advantages of the present invention will become apparent from the following description based with references to the accompanying drawings which illustrate examples of the present invention.

DETAILED DESCRIPTION OF THE PREFERRED EMBODIMENTS

Figure 2:
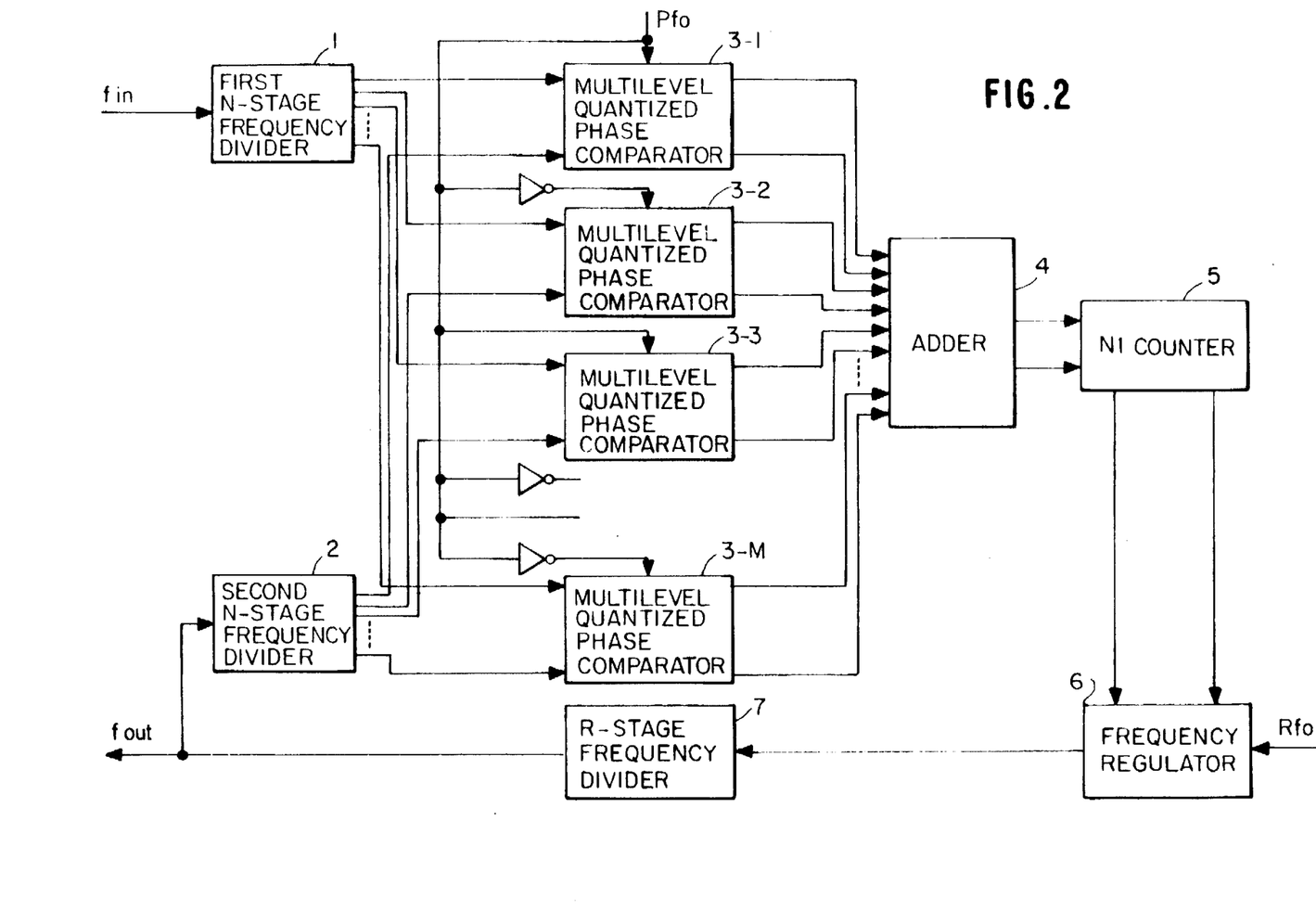
FIG. 2 is a block diagram of a digital PLL according to the first embodiment of the present invention.

Referring to FIG. 2, a digital PLL according to the first embodiment of the present invention is composed of a first N-stage frequency divider 1, a second N-stage frequency divider 2, M multilevel quantized phase comparators 3-1 to 3-M, an adder 4, an N1 counter 5, a frequency regulator 6, and an R-stage frequency divider 7.

First N-stage frequency divider 1 having M output group N-stage divides input clock frequency $f_{in}$ of the digital PLL, generates first phase, second phase, . . . , and Nth phase clocks synchronized with the first input clock, the second input clock, . . . , and the Nth input clock, respectively, divides these N clocks into M groups (N>M), and outputs the result.

Second N-stage frequency divider 2 having M output groups N-stage divides output clock frequency $f_{out}$ of the digital PLL, generates first phase, second phase, . . . , and Nth phase clocks synchronized with the first output clock, the second output clock, . . . , and the Nth output clock, respectively, divides these N clocks into M groups (N>M), and outputs the result.

Multilevel quantized phase comparator 3-1 receives an output signal of the first group of first N-stage frequency divider 1 and an output signal of the first group of second N-stage frequency divider 2 and outputs the phase difference between the two output signals as a value quantized in multiple levels. Multilevel quantized phase comparator 3-2 inputs an output signal of the second group of first N-stage frequency divider 1 and an output signal of the second group of second N-stage frequency divider 2 and outputs the phase difference between the two output signals as a value quantized in multiple levels. Multilevel quantized phase comparator 3-M inputs an output signal of the Mth group of first N-stage frequency divider 1 and an output signal of the Mth group of second N-stage frequency divider 2 and outputs the phase difference between the two output signals as a value quantized in multiple levels. Here, multilevel quantized phase comparators designated by odd ordinal numbers, 3-1, 3-3, . . . , count input phase differences at the rising edge of phase comparison (sampling) clock $Pf_0$, and multilevel quantized phase comparators designated by even ordinal numbers, 3-2, 3-4 count input phase difference at the falling edge sampling clock $Pf_0$of.

By using sampling clocks of both positive phase and negative phase in this way, sampling accuracy can be doubled as compared with using only a positive-phase sampling clock, and half-clock phase difference can be detected.

Adder 4 adds the phase difference information outputted from the M multilevel quantized phase comparators 3-1 to 3-M and outputs advanced pulses indicating phase advance and delayed pulses indicating phase delay. When input is of differing phase (increment and decrement), a value for the difference can be obtained.

N1 counter 5 is a competitive counter that inputs advanced pulses or delayed pulses, counts up in response to advanced pulses, and upon counting up to a count value 2N1 (a positive integer), both outputs an increment pulse and undergoes setting to initial value N1. In response to delayed pulses, N1 counter 5 counts down, and upon counting down to "0," both outputs a decrement pulse and undergoes setting to initial value N1.

Frequency regulator 6 is driven by standard drive clock $Rf_0$ of the digital PLL, eliminates one pulse from the pulse train of standard drive clock $Rf_0$ when one increment pulse is generated from N1 counter 5, and adds one pulse to the pulse train of standard drive clocks $Rf_0$ when one decrement pulse is generated from N1 counter 5.

R-stage frequency divider 7 R-stage frequency divides the output of frequency regulator 6, and outputs an output clock $f_{out}$ of the digital PLL. Here, R is a positive integer, any value being selectable. When the value of R is small, the phase jitter generated by addition and elimination of pulses increases, and when R is set to a large value, jitter can be decreased. In addition, the values of R, N, and $N_1$ are each independent.

Figures 3A, 3B:
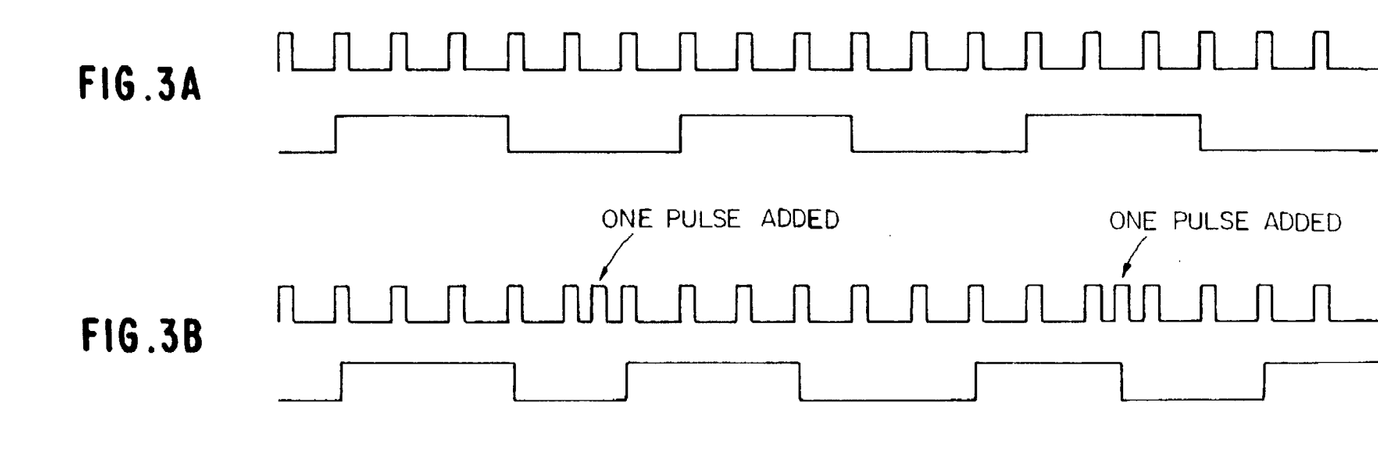
FIG. 3A is a waveform chart illustrating the standard drive clock waveform $Rf_0$ and the output waveform after the standard drive clock $Rf_0$ has been divided according to the first embodiment.
FIG. 3B is a waveform chart illustrating the drive clock waveform $Rf_0$ after a pulse has been added by the frequency regulator in response to a phase advance and the output waveform after the drive clock $Rf_0$ waveform has been divided according to the first embodiment.
Figure 3C:
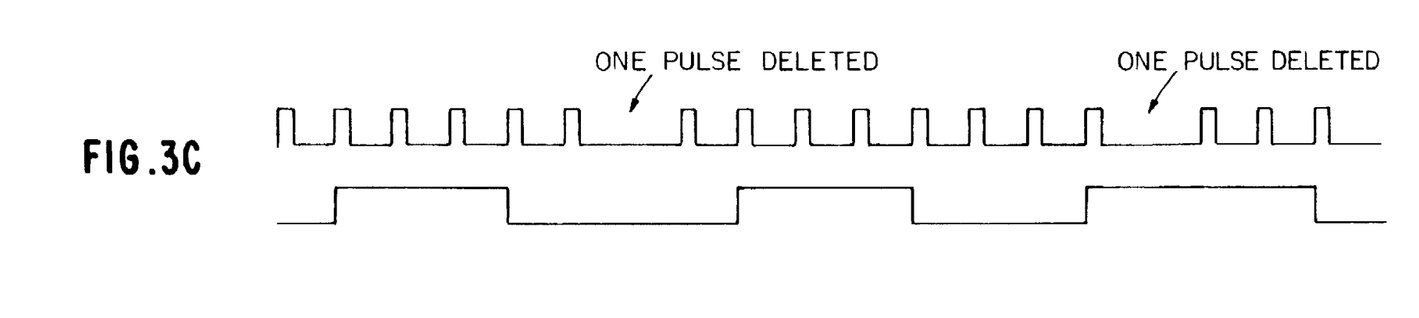
FIG. 3C is a waveform chart illustrating the drive clock waveform $Rf_0$ after a pulse has been deleted by the frequency regulator in response to a phase delay and the output waveform after the drive clock $Rf_0$ waveform has been divided according to the first embodiment.

FIG. 3A shows the output waveform after dividing the waveform of standard drive clock $Rf_0$ in a case where no control is performed. FIG. 3B shows the addition of 1 pulse to R-stage frequency dividing standard drive clock $Rf_0$ in a case where pulse addition is effected, and the output waveform after R-stage frequency division. By adding pulses in this way, output frequency following R-stage frequency dividing can be set to a high level. FIG. 3C shows the elimination of 1 pulse from R-stage frequency dividing standard drive clock $Rf_0$ in a case where pulse elimination is performed, and the output waveform after R-stage frequency division. By eliminating pulses in this way, output frequency following R-stage frequency division can be set to a low level.

As described hereinabove, phase can be pulled in by adding or eliminating pulses in frequency regulator 6. The generation of this addition and elimination of pulses are performed as the automatic control loop of the overall system. In other words, a phase locked loop is formed.

Figure 4:
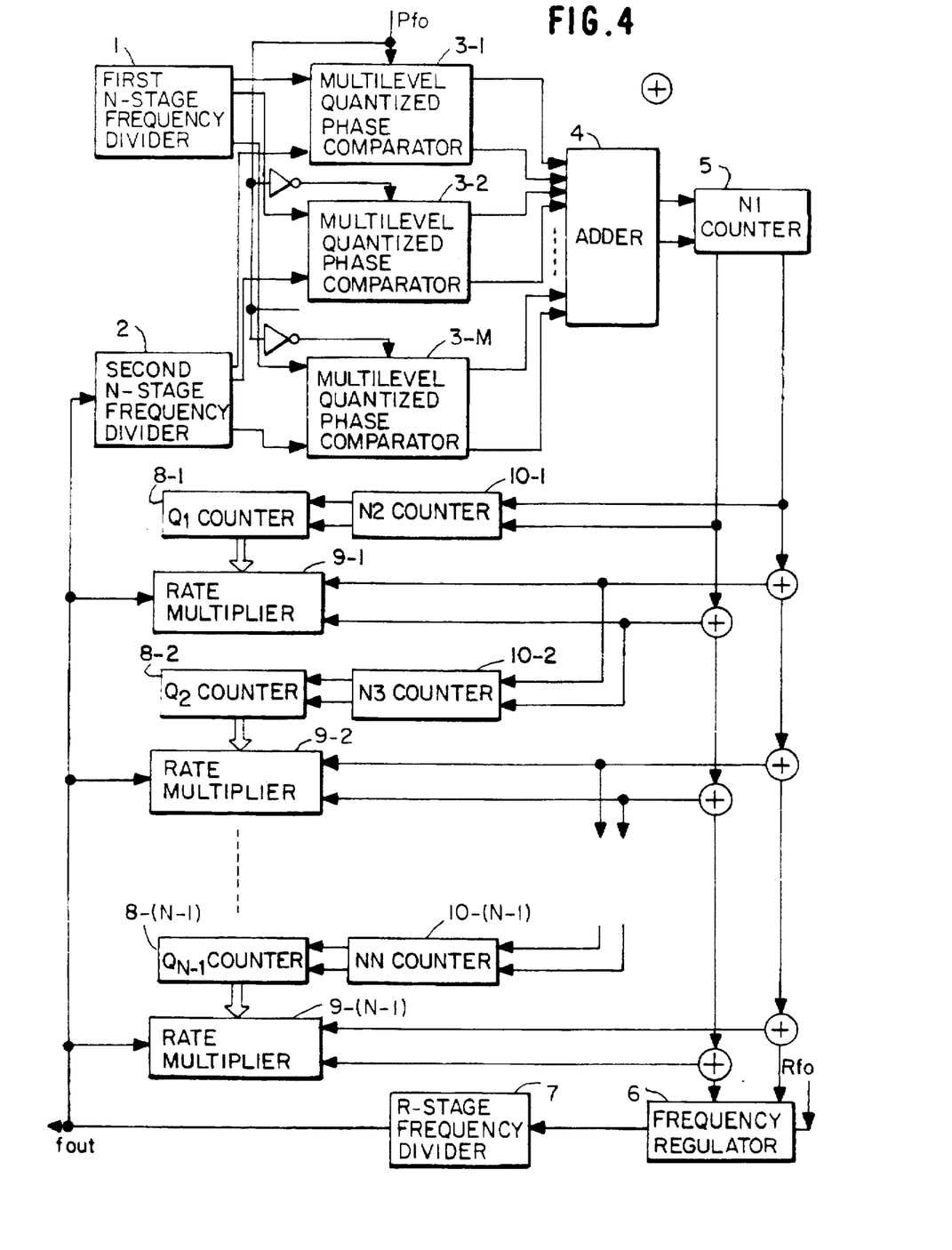
FIG. 4 is a block diagram showing an N-order digital PLL including a digital PLL according to the first embodiment.

FIG. 4 is a block diagram of an N-order digital PLL including the digital PLL of FIG. 2. This N-order digital PLL is made up of first N-stage frequency divider 1, second N-stage frequency divider 2, multilevel quantized phase comparators 3-1, 3-2, . . . , and 3-M, N1 counter 5, N2 counter 10-1, N3 counter 10-2, . . . , and NN counter 10-(N-1), frequency regulator 6, R-stage frequency divider 7, $Q_1$ counter 8-1, $Q_2$ counter 8-2, . . . , and $Q_{N-1}$ counter 8-(N-1) that store the center frequencies of N2 counter 10-1, N3 counter 10-2, . . . , and NN counter 10-(N-1), respectively, and rate multiplier 9-1, rate multiplier 9-2, . . . , and rate multiplier 9-(N-1) that generate increment pulses or decrement pulses appropriate to the center frequency of the system.

A complete second-order digital PLL construction is described in Electronic Information Communications Conference Papers (B-I, Vol. J73-B-I No. 8 pp. 650-659. August 1990) and as the operation of the N-order digital PLL of the present invention can be easily inferred from this publication, further explanation will be omitted here.

Figure 5:
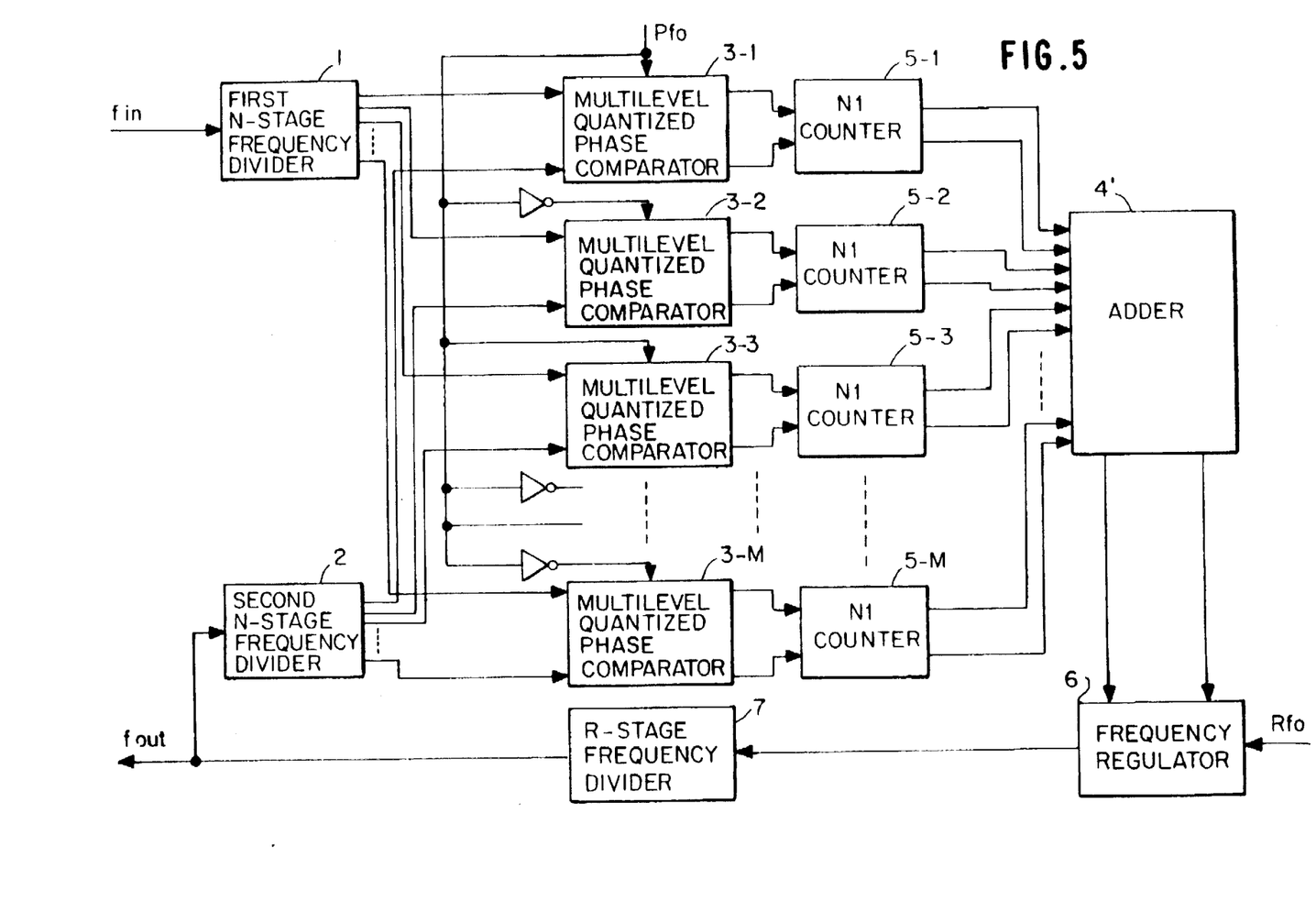
FIG. 5 is a block diagram showing a digital PLL according to the second embodiment of the present invention.

Referring to FIG. 5, a digital PLL according to the second embodiment of the present invention is constructed by providing in the embodiment of FIG. 2 N1 counters 5-1, 5-2, . . . , and 5-M immediately after multilevel quantized phase comparators 3-1, 3-2, . . . , and 3-M, respectively, and providing adder 4' immediately after N1 counter 5-1, 5-2, . . . , and 5-M.

N1 counters 5-1, 5-2, . . . , and 5-M are competitive counters that input either advanced pulses indicating phase advance or delayed pulses indicating phase delay which are outputted by the corresponding multilevel quantized phase comparators 3-1, 3-2, . . . , and 3-M, count up in response to the advanced pulses, and upon counting up to 2N1, both output an increment pulse and undergo setting to initial value N1. In response to the delayed pulses, the N1 counters 5-1, 5-2, . . . , and 5-M count down, and upon counting down to "0," both output a decrement pulse and undergo setting to initial value N1. Adder 4 adds the increment pulses or decrement pulses of the M N1 counters 5-1 to 5-M and output pulses of an advanced phase or a delayed phase. The operation of this embodiment is otherwise similar to that of FIG. 2.

Figure 6:
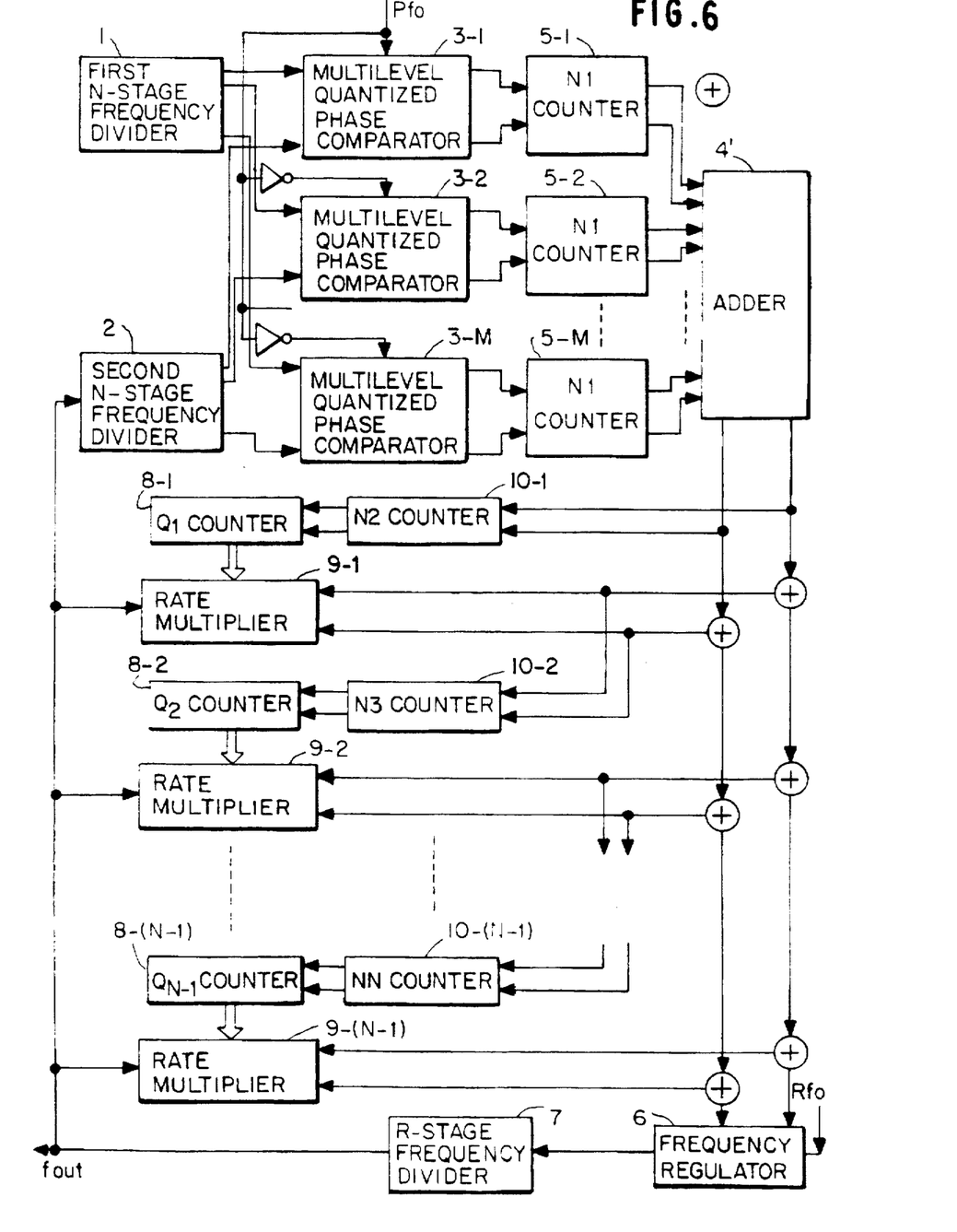
FIG. 6 is a block diagram showing a N-order digital PLL including a digital PLL of the second embodiment.

FIG. 6 is a block diagram showing an N-order digital PLL that includes the digital PLL of FIG. 5.

While preferred embodiments of the present invention have been described using specific terms, such description is for illustrative purposes only, and it is to be understood that changes and variations may be made without departing from the spirit or scope of the following claims.

What is claimed is:

1. A digital Phase-Locked Loop (PLL) comprising:

first N-stage frequency dividing means that N-stage frequency divides an input clock and generates N input clocks, each of said N input clocks having a first phase, a second phase, . . . , and an Nth phase, respectively, separates said N input clocks into a first set of M groups (N>M), and outputs said first set of M groups;

second N-stage frequency dividing means that N-stage frequency divides an output clock of said digital PLL, generates N output clocks, each of said N output clocks having a first phase, a second phase, . . . , and an Nth phase, respectively, separates said N output clocks into a second set of M groups (N>M), and outputs said second set of M groups;

M multilevel quantized phase comparison means including first multilevel quantized phase comparison means for receiving a first group of said first set of M groups output from said first N-stage frequency dividing means and a first group of said second set of M groups output from said second N-stage frequency dividing means and outputs a first phase difference between said first groups as a value quantized in multiple levels, second multilevel quantized phase comparison means for receiving a second group of said first set of M groups output from said first N-stage frequency dividing means and a second group of said second set of M groups output from said second N-stage frequency dividing means and outputs a second phase difference between said second groups as a value quantized in multiple levels; and Mth multilevel quantized phase comparison means for receiving an Mth group of said first set of M groups output from said first N-stage frequency dividing means and an Mth group of said second set of M groups output from said second N-stage frequency dividing means and outputs an Mth phase difference between said Mth groups as a value quantized in multiple levels;

adding means that adds a plurality of phase differences outputted from the M multilevel quantized phase comparison means, determines a phase difference sum, and outputs advanced pulses if said phase difference sum indicates phase advance between said groups and outputs delayed pulses if said phase difference sum indicates phase delay between said groups;

counting means, having an initial count value, for receiving said advanced pulses or said delayed pulses, and which counts up in response to said advanced pulses and, upon counting up to a second count value which is twice said initial count value, outputs an increment pulse and undergoes resetting to said initial value; said counting means counting down in response to said delayed pulses, and, upon counting down to zero, both outputs a decrement pulse and undergoes resetting to said initial value;

frequency regulating means that is driven by a drive clock having a pulse train, eliminates one pulse from the pulse train of said drive clock when one increment pulse is output from said counting means, and adds one pulse to the pulse train of said drive clock when one decrement pulse is output from said counting means; and R-stage frequency dividing means that divides the frequency of an output of said frequency regulating means and outputs a signal which is output as the output clock of the digital PLL, which is frequency divided by said second N-stage frequency dividing means;

wherein said M multilevel quantized phase comparison means include a first plurality of multilevel quantized phase comparison means driven by a phase count clock of positive phase and a second plurality of multilevel quantized phase comparison means driven by a phase count clock of negative phase.

2. A digital PLL according to claim 1 further comprising at least one rate multiplier for generating increment pulses and decrement pulses appropriate for a center frequency of said N clocks, and wherein said digital PLL is of N-order.

3. A digital Phase-Locked Loop (PLL) comprising:

first N-stage frequency dividing means that N-stage frequency divides an input clock and generates N input clocks, each of said N input clocks having a first phase, a second phase, . . . , and an Nth phase, respectively, separates said N input clocks into a first set of M groups (N>M), and outputs said first set of M groups;

second N-stage frequency dividing means that N-stage frequency divides an output clock of said digital PLL, generates N output clocks, each of said N output clocks having a first phase, a second phase, . . . , and an Nth phase, respectively, separates said N output clocks into a second set of M groups (N>M), and outputs said second set of M groups;

M multilevel quantized phase comparison means including first multilevel quantized phase comparison means for receiving a first group of said first set of M groups output from said first N-stage frequency dividing means and a first group of said second set of M groups output from said second N-stage frequency dividing means and outputs a first phase difference between said first groups as a value quantized in multiple levels, second multilevel quantized phase comparison means for receiving a second group of said first set of M groups output from said first N-stage frequency dividing means and a second group of said second set of M groups output from said second N-stage frequency dividing means and outputs a second phase difference between said second groups as a value quantized in multiple levels; and Mth multilevel quantized phase comparison means for receiving an Mth group of said first set of M groups output from said first N-stage frequency dividing means and an Mth group of said second set of M groups output from said second N-stage frequency dividing means and outputs an Mth phase difference between said Mth groups as a value quantized in multiple levels;

a plurality of counting means, each counting means having an initial count value, corresponding to each of said M multilevel quantized phase comparison means, for receiving advanced pulses if said phase differences between said groups outputted by respective multilevel quantized phase comparison means indicates phase advance and output delayed pulses if said phase differences between said groups outputted by the respective multilevel quantized phase comparison means indicates phase delay, said plurality of counting means counting up in response to said advanced pulses and, upon counting up to a count value which is twice said initial count value said plurality of counting means output an increment pulse and undergo resetting to said initial value; and wherein said plurality of counting means count down in response to said delayed pulses, and, upon counting down to zero, output a decrement pulse and undergo resetting to said initial value;

adding means that adds increment pulses or decrement pulses of said plurality of counting means and outputs pulses indicating advanced phase or delayed phase;

frequency regulating means that is driven by a drive clock having a pulse train, eliminates one pulse from the pulse train of said drive clock when one pulse of advanced phase is output from said adding means, and adds one pulse to the pulse train of said drive clock when one pulse of delayed phase is output from said adding means; and R-stage frequency dividing means that divides the frequency of an output of said frequency regulating means and outputs a signal which is output as the output clock of the digital PLL, which is frequency divided by said second N-stage frequency dividing means;

wherein said M multilevel quantized phase comparison means include a first plurality of multilevel quantized phase comparison means driven by a phase count clock of positive phase and a second plurality of multilevel quantized phase comparison means driven by a phase count clock of negative phase.

4. A digital PLL according to claim 3, further comprising at least one rate multiplier for generating increment pulses and decrement pulses appropriate for a center frequency of said N clocks, and wherein said digital PLL is of N-order.

\* \* \* \* \*

UNITED STATES PATENT AND TRADEMARK OFFICE
CERTIFICATE OF CORRECTION

PATENT NO. : 5,694,068
DATED : December 2, 1997
INVENTOR(S) : Yoshinori ROKUGO

It is certified that error(s) appears in the above-identified patent and that said Letters Patent is hereby corrected as shown below:

Column 3, line 14, before "By" insert --an N-order digital PLL of the present invention includes the above described digital PLL--.

Column 4, line 28, after "3-4" insert --,...,-- line 29, delete "of".

Signed and Sealed this

Fifth Day of May, 1998

Attest:

BRUCE LEHMAN

Attesting Officer

Commissioner of Patents and Trademarks